United States Patent
Sasaki et al.

(10) Patent No.: US 7,382,347 B2
(45) Date of Patent: Jun. 3, 2008

(54) SHIFT REGISTER FOR PULSE-CUT CLOCK SIGNAL

(75) Inventors: Yasushi Sasaki, Saitama-ken (JP); Tetsuo Morita, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 633 days.

(21) Appl. No.: 11/003,759

(22) Filed: Dec. 6, 2004

(65) Prior Publication Data

US 2005/0185752 A1 Aug. 25, 2005

Related U.S. Application Data

(62) Division of application No. 10/118,129, filed on Apr. 9, 2002, now Pat. No. 6,928,135.

(30) Foreign Application Priority Data

Apr. 13, 2001 (JP) ............................. 2001-116010

(51) Int. Cl.
G09G 3/36 (2006.01)
(52) U.S. Cl. ........................................ 345/100; 345/98
(58) Field of Classification Search .......... 345/87–100, 345/204
See application file for complete search history.

(56) References Cited

U.S. PATENT DOCUMENTS 5,222,082 A 6/1993 Plus
5,510,805 A * 4/1996 Lee .............................. 345/58
5,517,542 A 5/1996 Huq
5,648,790 A * 7/1997 Lee .............................. 345/58
5,701,136 A 12/1997 Huq et al.
5,949,398 A 9/1999 Kim
6,300,928 B1 10/2001 Kim
6,339,631 B1 1/2002 Yeo et al.
6,426,743 B1 7/2002 Yeo et al.
6,928,135 B2 * 8/2005 Sasaki et al. .................. 377/64

FOREIGN PATENT DOCUMENTS

JP 2000-155550 6/2000

OTHER PUBLICATIONS

Yong-Min Ha, et al. Low temperature Poly-Si TFT LCD with 5 Mask Fabrication Process: Euro Display 99 Late- News Paper, pp. 105-109.
Yong-Min Ha, "P-type Technology for Large Size Low Temperature Poly-Si TFT-LCDs" SID 00 Digest, pp. 1116-1119.

* cited by examiner

Primary Examiner—Nitin I. Patel
(74) Attorney, Agent, or Firm—Oblon, Spivak, McClelland, Maier & Neustadt, P.C.

(57) ABSTRACT

When a voltage level of a pulse-cut first clock signal inputted to a first clock terminal is reversed in the state where a first transistor is turned on and a second transistor is turned off, an anti-reversal circuit including a seventh transistor and an eighth transistor supplies a high voltage VDD to a node n2. In this way, a floating state of the node n2 is avoided, and the voltage level of the node n2 is prevented from being reversed. Accordingly, the second transistor will not be turned on in the interval, whereby electric potential of an output signal is stably maintained.

4 Claims, 11 Drawing Sheets

SHIFT REGISTER FOR PULSE-CUT CLOCK SIGNAL

CROSS-REFERENCE TO RELATED APPLICATIONS

This application is based upon and claims the benefit of priority from prior Japanese Patent Application No. 2001-116010 filed on Apr. 13, 2001; the entire contents of which are incorporated by reference herein.

BACKGROUND OF THE INVENTION

1. Field of the Invention

This invention relates to a shift register in an electronic circuit being operated by a pulse-cut clock signal, and to a drive circuit, an electrode substrate and a display device that include the shift register.

2. Description of the Related Art

Display devices as represented by liquid crystal display devices are used in various instruments because of their thin profile, light weight and low power consumption. In recent years, an active matrix liquid crystal display device, in which transistors are disposed for each pixel, has become widespread in notebook computers or personal digital assistants. Technology for forming polysilicon thin-film transistors (p-SiTFT's) at a relatively low-temperature process has been established. The p-SiTFT's possess higher electron mobility in comparison with amorphous silicon thin-film transistors used in conventional liquid crystal display devices. Accordingly, downsizing of the transistors has been effectuated. This technology has realized the integral formation of a pixel unit and a drive circuit on an electrode substrate in the same fabricating process. The pixel unit includes transistors disposed in plural on intersections of a plurality of scan lines and a plurality of signal lines. The drive circuit drives each transistor.

There are two kinds of drive circuit. One is a scan line drive circuit for outputting pulses to the scan lines. The other is a signal line drive circuit for outputting pulses to the signal lines. Each of the drive circuits includes a plurality of electrically cascaded shift registers. Each shift register shifts a phase of an inputted signal and then outputs the signal. The scan line drive circuit outputs horizontal scan pulses to the respective scan lines while shifting a phase of each pulse by one stage. The signal line drive circuit outputs vertical scan pulses to analog switches provided in plural on the signal lines while shifting a phase of each pulse by one stage. Image signals are inputted to the analog switches from outside, and the signal line drive circuit outputs the image signals to the respective signal lines.

In order to facilitate manufacturing, there is a case in which these shift registers are merely composed of either p-channel metal-oxide semiconductor (p-MOS) transistors or n-channel metal-oxide semiconductor (n-MOS) transistors. Literature disclosing such shift registers includes: U.S. Pat. No. 5,222,082; Japanese Unexamined Patent Publication No. 2000-155550; SID 00 DIGEST, pp 1116-1119; and EURO DISPLAY 99 LATE-NEWS PAPER, pp 105-109.

Incidentally, regarding the horizontal scan pulses or the vertical scan pulses, if temporally adjacent pulses overlap each other, such overlap may incur display unevenness because an image signal may be written into a pixel which is not supposed to receive the signal, or because the image signal is not adequately written into a pixel which is supposed to receive the signal. A method for preventing the unevenness is so-called "pulse cut". This method provides time intervals between the leading-edge and the trailing-edge of a plurality of clock signals inputted to the shift registers.

However, if a pulse-cut clock signal is inputted to a shift register, time deviation occurs among transistors in the shift register. As a result, the transistors constituting an output circuit of the shift register may not be turned on and off properly, whereby voltage levels of outputted signals may become unstable.

SUMMARY OF THE INVENTION

An object of this invention is to provide a shift register capable of outputting an output signal at a stable voltage level if a pulse-cut clock signal is inputted thereto, and to provide a drive circuit, an electrode substrate, and a display device including the shift register.

A shift register according to one embodiment of this invention includes: an output circuit including a first transistor having a first conductive path between a first clock terminal and an output terminal, and a second transistor having a second conductive path between the output terminal and a voltage electrode; an input circuit including a third transistor having a third conductive path between an input terminal and a control electrode of the first transistor, and a fourth transistor having a fourth conductive path between the input terminal and a control electrode of the second transistor; a reset circuit including a fifth transistor having a fifth conductive path between a second clock terminal and the control electrode of the second transistor, and a sixth transistor having a sixth conductive path between the control electrode of the first transistor and the control electrode of the second transistor; and an anti-reversal circuit configured to prevent a voltage level at the control electrode of the second transistor from being reversed, when a voltage level of a first clock signal inputted to the first clock terminal is reversed in the state where the first transistor is turned on and the second transistor is turned off.

DETAILED DESCRIPTION OF EMBODIMENTS

Figure 1:
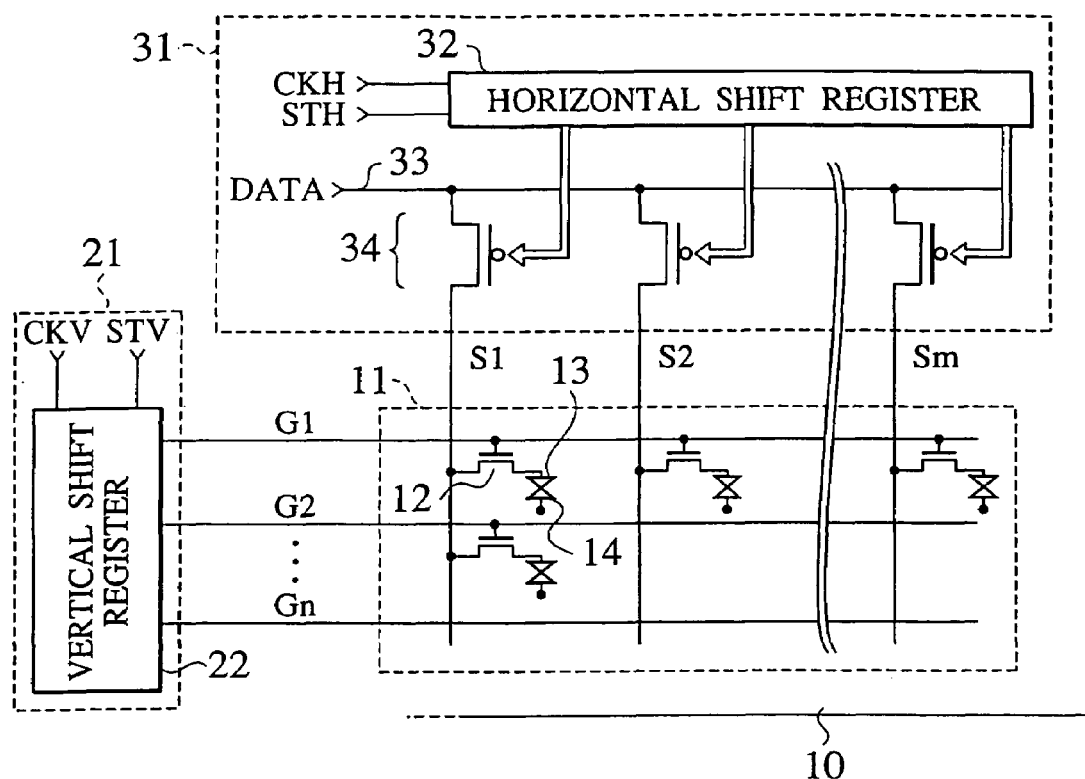
FIG. 1 is a circuit diagram of a first embodiment of a display device.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 2:
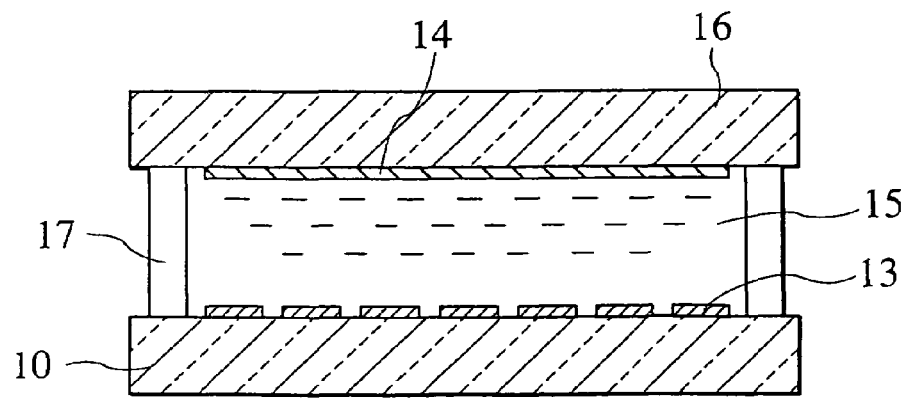
FIG. 2 is a schematic cross-sectional view of the display device shown in FIG. 1.

As shown in FIG. 1 and FIG. 2, A plurality of scan lines G1, G2, . . . , to Gn (hereinafter collectively referred to as G) and a plurality of signal lines S1, S2, . . . , to Sm (hereinafter collectively referred to as S) are arranged to intersect one another on a pixel unit 11 provided on a first electrode substrate 10 inside a display device. On every intersection, a pixel transistor 12 and a pixel electrode 13 are disposed. The pixel transistor 12 is equivalent to a p-SiTFT, for example. A gate of each pixel transistor 12 is connected with the scan line G, a source thereof is connected with the signal line S and a drain thereof is connected with the pixel electrode 13 as well as an auxiliary capacitor. A scan line drive circuit 21 and a signal line drive circuit 31 drive the pixel transistors 12. The pixel unit 11, the scan line drive circuit 21, and the signal line drive circuit 31 are integrally formed on the first electrode substrate 10 in the same fabricating process.

An opposite electrode 14 electrically opposing the pixel electrodes 13 is formed on a surface of a second electrode substrate 16, which is opposite to the first electrode substrate 10. Those two electrode substrates 10 and 16 secure a display layer 15 between them. A sealing member 17 seals the peripheries of the both electrode substrates. The display layer 15 is equivalent to a liquid crystal layer in a liquid crystal display device.

The scan line drive circuit 21 includes a vertical shift register 22, a level shifter, and a buffer circuit. A vertical clock signal (CKV) and a vertical start signal (STV) synchronized with the CKV are inputted to the vertical shift register 22. The vertical shift register 22 generates the vertical scan pulses by shifting a phase of the vertical start signal by one stage with respect to each of the scan lines G. The level shifter and the buffer circuit amplify a voltage and a current of the vertical scan pulses, and output them to the respective scan lines G.

The signal line drive circuit 31 includes a horizontal shift register 32, an image signal bus 33, and a plurality of analog switches 34 provided for the signal lines S. A horizontal clock signal (CKH) and a horizontal start signal (STH) synchronized with the CKH are inputted to the horizontal shift register 32. The horizontal shift register 32 generates horizontal scan pulses by shifting a phase of the horizontal start signal by one stage, and outputs the horizontal pulses to the respective analog switches 34. Image signals (DATA) are supplied to the image signal bus 33 from outside. The analog switches 34 perform sampling of the image signals in accordance with the horizontal scan pulses, and output the image signals to the signal lines S.

Figure 3:
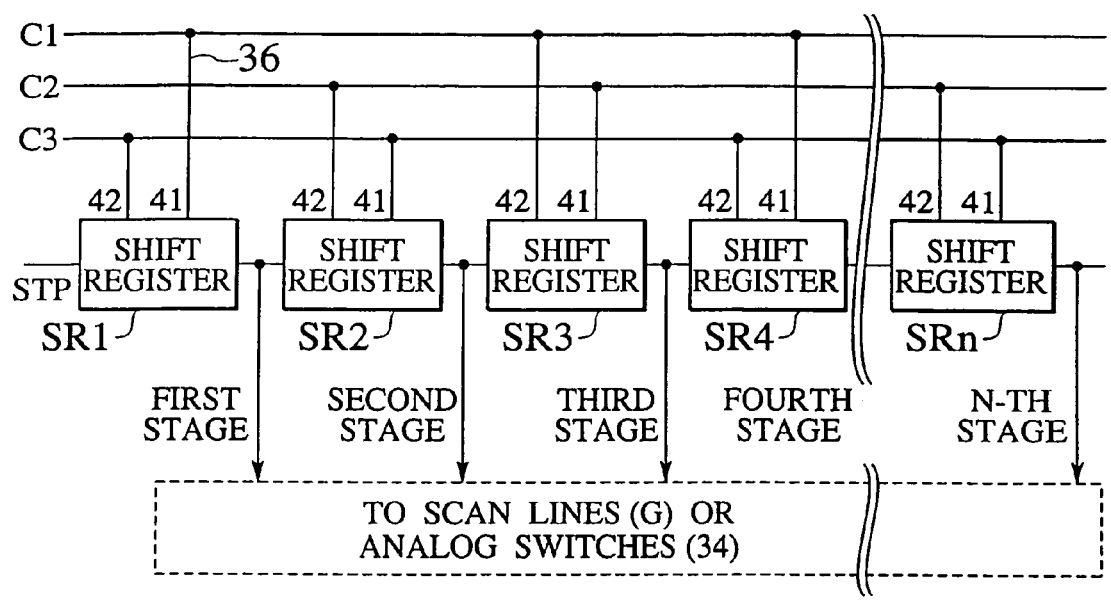
FIG. 3 is a block diagram of a three-phase shift register used for a vertical shift register or a horizontal shift register shown in FIG. 1.

A three-phase shift register shown in FIG. 3 can be used for at least any one of the vertical shift register 22 and the horizontal shift register 32. Here, for the sake of convenience, one of the drive circuits using the three-phase shift register will be referred to as a first drive circuit, and the other will be referred to as a second drive circuit.

The three-phase shift register includes a plurality of electrically cascaded shift registers SR1, SR2, . . . , to SRn (hereinafter collectively referred to as SR), clock lines 36, and output lines 37. The shift registers SR1, SR2, . . . , to SRn correspond to a first stage, a second stage, . . . , to an n-th stage, respectively. The clock lines 36 are for inputting any two clock signals of C1, C2 and C3 (CKV or CKH) to the respective shift registers SR. The output lines 37 are for outputting the output signals from the respective shift registers SR to the scan lines G or the analog switches 34. Each of the shift registers SR includes two clock terminals 41 and 42. For example, regarding the shift register SR1, C1 is inputted to a first clock terminal 41 as a first clock signal, and C3 is inputted to a second clock terminal 42 as a second clock signal. Regarding the shift register SR2, C3 is inputted to the first clock terminal 41 as the first clock signal, and C2 is inputted to the second clock terminal 42 as the second clock signal.

A start signal STP (STV or STH) is inputted to the shift register SR1 as an input signal IN. An output signal from a previous stage is inputted to each of the shift registers SR2 to SRn as the input signal IN. Each of the shift resisters SR outputs an output signal OUT, which is generated by shifting a phase of the input signal IN synchronously with the two clock signals. The vertical shift register 22 outputs the output signals OUT from the respective shift registers SR to the respective scan lines G as vertical scan pulses. The horizontal shift register 32 outputs the output signals OUT from the respective shift registers SR to the respective analog switches 34 as horizontal scan pulses.

Figure 4:
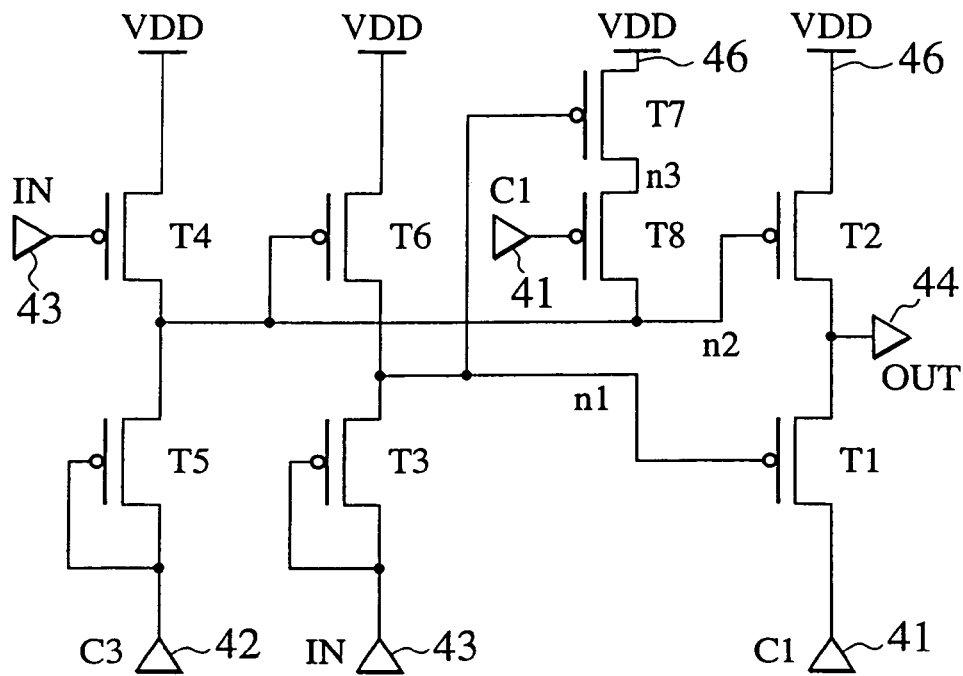
FIG. 4 is a circuit diagram of the first embodiment of a shift register shown in FIG. 3.

In the following, a constitution of the shift registers SR will be described. As shown in FIG. 4, all eight transistors included in each of the shift registers SR are p-MOS transistors, for example. Here, the expression "a conductive path" refers to a state where a transistor is sandwiched in between two or three elements so as to electrically communicate a signal between the elements, regardless of whether or not the elements are physically connected to the transistor.

An output circuit includes a first transistor T1 and a second transistor T2. The first transistor T1 has a first conductive path between the first clock terminal 41 and an output terminal 44. The second transistor T2 has a second conductive path between the output terminal 44 and a voltage electrode 46. More concretely, a drain of the first transistor T1 is electrically connected to the first clock terminal 41 and a source thereof is electrically connected to the output terminal 44. A source of the second transistor T2 is electrically connected to the voltage electrode 46 and a drain thereof is electrically connected to the output terminal 44. Here, the first clock signal C1 is inputted to the first clock terminal 41 and a high voltage VDD is supplied to the voltage electrode 46. The output circuit outputs the first clock signal C1 to the output terminal 44 when the first transistor T1 is turned on and the second transistor T2 is turned off, and the output circuit outputs the high voltage VDD from the voltage electrode 46 to the output terminal 44 when the first transistor T1 is turned off and the second transistor T2 is turned on.

An input circuit includes a third transistor T3 and a fourth transistor T4. The third transistor T3 has a third conductive path between an input terminal 43 and a control electrode of the first transistor T1. The fourth transistor T4 has a fourth conductive path between the input terminal 43 and a control electrode of the second transistor T2. More concretely, a drain and a gate of the third transistor T3 are electrically connected to the input terminal 43 and a source thereof is electrically connected to the control electrode of the first transistor T1. Meanwhile, a source of the fourth transistor T4 is electrically connected to the voltage electrode 46, a drain thereof is electrically connected to the control electrode of the second transistor T2, and a gate thereof is electrically connected to the input terminal 43. The input circuit receives the input signal IN through the input terminal 43. Here, a conductive path to the control electrode of the first transistor T1 is referred to as a node n1, and a conductive path to the control electrode of the second transistor T2 is referred to as a node n2.

A reset circuit includes a fifth transistor T5 and a sixth transistor T6. The fifth transistor T5 has a fifth conductive path between the second clock terminal 42 and the control electrode of the second transistor T2. The sixth transistor T6 has a sixth conductive path between the control electrode of the first transistor T1 and the control electrode of the second transistor T2. More concretely, a drain and a gate of the fifth transistor T5 are electrically connected to the second clock terminal 42 and a source thereof is electrically connected to the control electrode of the second transistor T2. Meanwhile, a drain of the sixth transistor T6 is electrically connected to the control electrode of the first transistor T1, a gate thereof is electrically connected to the control electrode of the second transistor T2, and a source thereof is electrically connected to the voltage electrode 46. The second clock signal C3 is inputted to the second clock terminal 42. The reset circuit turns on any one of the first transistor T1 and the second transistor T2, and turns off the other.

An anti-reversal circuit includes a seventh transistor T7 and an eighth transistor T8. The seventh transistor T7 has a seventh conductive path between the control electrode of the first transistor T1 and the voltage electrode 46. The eighth transistor T8 has a eighth conductive path between the control electrode of the second transistor T2, the first clock terminal 41 and the seventh transistor T7. More concretely, a gate of the seventh transistor T7 is electrically connected to the control electrode of the first transistor T1 and a source thereof is electrically connected to the voltage electrode 46. Meanwhile, a gate of the eighth transistor T8 is electrically connected to the first clock terminal 41, a drain thereof is electrically connected to the control electrode of the second transistor T2 and a source thereof is electrically connected to a drain of the seventh transistor T7. Here, the conductive path between the drain of the seventh transistor T7 and the source of the eighth transistor T8 is referred to as node n3. The anti-reversal circuit prevents a voltage level at the control electrode of the second transistor T2 from being reversed, which is attributable to a floating state of the control electrode of the second transistor T2, where if a voltage level of the first clock signal C1 is reversed in the state where the first transistor T1 is turned on and the second transistor T2 is turned off. Here, the floating state refers to a state where electric potential is easily variable because the high voltage VDD is not supplied.

Figure 5:
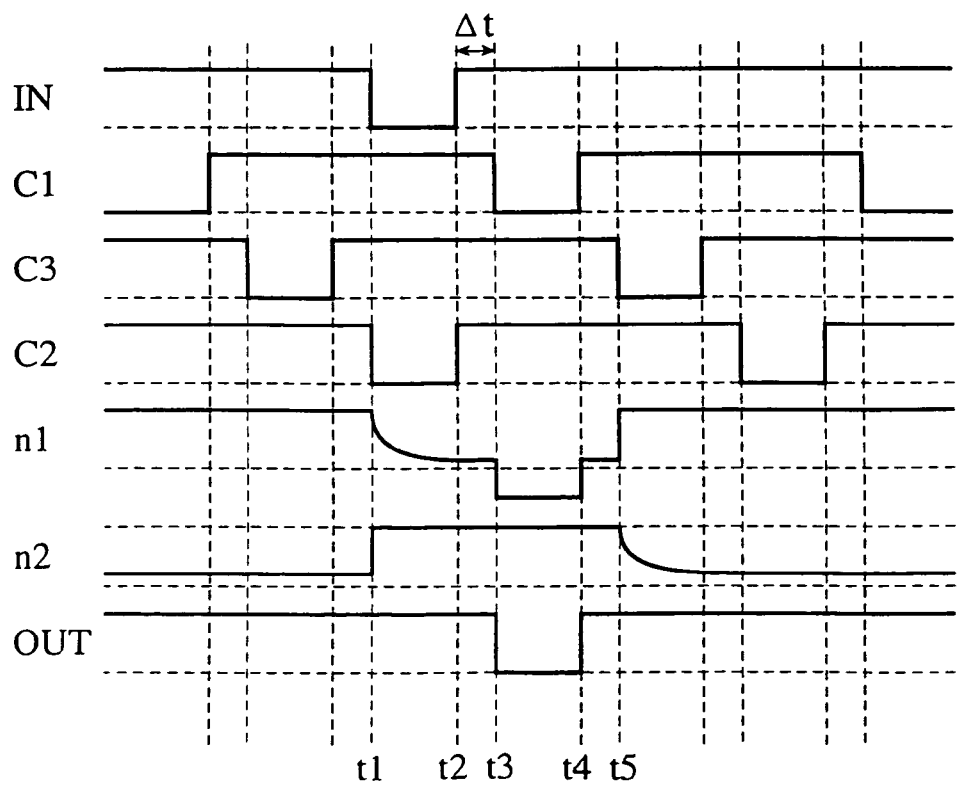
FIG. 5 is a timing chart showing relations among signals used in the shift register shown in FIG. 4.

Next, an operation of the shift register SR1 will be described. FIG. 5 is a timing chart of relations between the input signal IN, the clock signals C1 to C3, the nodes n1 and n2, and the output signal OUT concerning the shift register SR1. The output signal OUT is equivalent to the phase-shifted input signal IN. The clock signals C1 to C3 are pulse-cut respectively. That is, each of the clock signals is provided with time intervals Δt between leading edges and trailing edges thereof Note that the other shift registers SR2 to SRn operate similarly to the shift register SR1 in accordance with the timing chart shown in FIG. 5.

At a moment t1, when the input signal IN at a low level is inputted to the input terminal 43, the third transistor T3 and the fourth transistor T4 are turned on. Since the second clock signal C3 is at a high level, the fifth transistor T5 is in an off-state. The node n2 rises to a high level as the high voltage VDD is supplied from the fourth transistor T4 thereto, whereby the second transistor T2 and the sixth transistor T6 are turned off. The node n1 is set in the floating state as well as at the low level because the input signal IN at a low level is supplied from the third transistor T3. The first transistor T1 and the seventh transistor T7 are turned on accordingly. Then the first clock signal C1 at a high level is supplied from the first transistor T1 to the output terminal 44, whereby the output signal OUT is maintained at a high level.

At a moment t2, when the electric potential of the input signal IN is reversed from a low level to a high level, the third transistor T3 and the fourth transistor T4 are turned off, and the node n2 is set to the floating state. However, the node n2 is not grounded because the fifth transistor T5 is turned off, whereby electric potential of the node n2 at a high level is retained by a parasitic capacitor of the second transistor T2. The sixth transistor T6 remains in an off-state because the electric potential of the node n2 is maintained at the high level, and the electric potential of the node n1 maintains at the low level in the floating state. Here, if ratios between channel widths and channel lengths (W/L ratios) of parts of the first transistor T1 are set sufficiently larger than those of the third transistor T3 in advance, it is possible to enable the node n1 to be less affected by potential variation at the third transistor T3 when it is switched.

At a third moment t3, when the electric potential of the first clock signal C1 is reversed from a high level to a low level, the electric potential of the node n1 in the floating state becomes a level (at LL level) which is even lower than the low level. This is because a parasitic capacitor exists between the gate and the source of the first transistor T1 or between the gate and the drain thereof. Accordingly, the electric potential of the node n1 varies in line with variation in electric potential between the drain and the source of the first transistor T1, unless the high voltage VDD is supplied to the gate, that is, to the node n1. Here, a phenomenon where the electric potential of a node in a floating state varies at the influence of variation in electric potential at a connected transistor is referred to as a bootstrap, and the node is referred to as a bootstrap node.

In this event, the seventh transistor T7 and the eighth transistor T8 in the anti-reversal circuit are turned on, whereby the high voltage VDD is supplied to the node n2 through the seventh transistor T7 and the eighth transistor T8. Accordingly, the node n2 is no longer in the floating state, but the node n2 maintains stable electric potential at a high level. In this way, the second transistor T2 is maintained in the off-state. Since the first transistor T1 is in the on-state and the second transistor T2 is in the off-state, the first clock signal C1 at the low level is supplied to the output terminal 44, whereby the electric potential of the output signal OUT becomes a stable low level.

Assuming that there is no anti-reversal circuit, when the electric potential of the first clock signal C1 is reversed from the high level to the low level at the moment t3, voltage between the source and the drain of the second transistor T2 is reduced. Based upon the foregoing, the electric potential of the node n2 in the floating state is also reduced. Then the second transistor T2 starts conducting and the high voltage VDD is supplied to the output terminal 44 through the second transistor T2. Eventually, the voltage level of the output signal OUT increases and the voltage waveform thereof becomes distorted.

The reason for the node n2 being set to the floating state in the interval between the moment t2 and the moment t3 is because the pulse-cutting created the interval. If the clock signals C1 to C3 are not pulse-cut, the moment t2 and the moment t3 become one identical moment. At that moment when the first clock signal C1 is reversed from the high level to the low level, the node n2 is not in the floating state because the fourth transistor T4 is turned on. In this case, the electric potential of the node n2 is not reduced even if the first clock signal C1 is reversed from the high level to the low level. On the other hand, when the clock signals C1 to C3 are pulse-cut, the electric potential of the node n2 is maintained at the high level in the interval between the moment t2 and the moment t3 as previously described, nevertheless, the node n2 is in the floating state because the high voltage VDD is not supplied to the node n2.

Accordingly, the anti-reversal circuit is provided in this embodiment, in order to avoid the floating state of the node n2, by supplying the high voltage VDD to the node n2 when the first clock signal C1 is reversed from the high level to the low level in the state where the first transistor T1 is turned on and the second transistor T2 is turned off, thus preventing the electric potential of the node n2 from being reversed from the high level to the low level. In this way, the second transistor T2 will not be turned on during an interval when the first clock signal C1 is at the low level, whereby the electric potential of the output signal OUT will be stably maintained at the low level during the interval.

Moreover, since the electric potential of the node n2 is not reduced at the moment t3, the sixth transistor T6 is maintained to the off-state. So, the high voltage VDD is not supplied from the sixth transistor T6 to the node n1, and the first transistor T1 is not turned off. As a result, the output signal OUT at the low level without distortion will be supplied to the output terminal 44.

At a moment t4, when the electric potential of the first clock signal C1 is changed to the high level, the eighth transistor T8 is turned off, and the first transistor T1 is maintained in the on-state. The first clock signal C1 is supplied to the output terminal 44 through the first transistor T1, whereby the electric potential of the output signal OUT is changed to the high level.

At a moment t5, when the electric potential of the second clock signal C3 is changed to the low level, the fifth transistor T5 is turned on, and the node n2 is changed to the low level because the eighth transistor T8 is in the off-state. The second transistor T2 and the sixth transistor T6 are turned on, whereby the node n1 is changed to the high level and the seventh transistor T7 is turned off. Since the first transistor T1 is also turned off, the high voltage VDD is supplied to the output terminal 44 through the second transistor T2, whereby the electric potential of the output signal OUT is maintained at the high level.

After the moment t5, the input signal IN is fixed at the high level. The node n1 is fixed at the high level, while the node n2 is maintained at the low level, and the output signal OUT is maintained at the high level. Here, if W/L ratios of parts of the second transistor T2 are set sufficiently larger than those of the fifth transistor T5, it is possible to hold the node n2 at the low level by reducing the influence of coupling between the gate and the drain of the fifth transistor T5. In addition, since the seventh transistor T7 is in the off-state, a high-level signal voltage will not be supplied to the node n2 until the input signal IN is changed to the low level again.

As described above, the first embodiment provides the shift register operated by the pulse-cut clock signals C1 to C3, in which the anti-reversal circuit supplies the high voltage VDD to the node n2 when the electric potential of the first clock signal C1 is reversed from the high level to the low level in the state where the first transistor T1 is turned on and the second transistor T2 is turned off. In this way, the floating state of the node n2 is avoided, whereby the electric potential of the node n2 is prevented from being reversed from the high level to the low level. Accordingly, conduction of the second transistor T2 is prevented, whereby the output signal OUT can be outputted at the low level without distortion.

In a display device using the above-described shift register, it is possible to operate the shift register by use of the pulse-cut clock signals. So, the display device can prevent display unevenness attributable to the insufficient writing of an image signal into pixels, and thus the display device can obtain fine display quality.

Incidentally, as shown in FIG. 5, the anti-reversal circuit is sufficient in terms of the circuit having a constitution to supply the high voltage VDD to the node n2 when the first clock signal C1 is reversed at the moment t3. In the following, description will be made regarding embodiments of various other shift registers.

Second Embodiment

Figure 6:
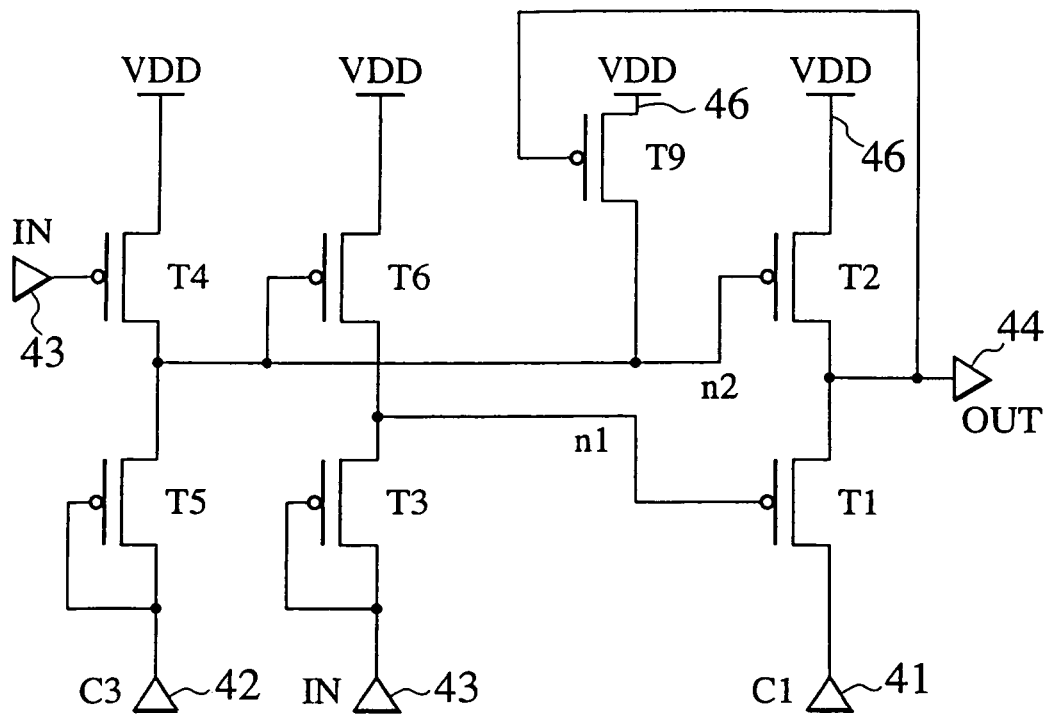
FIG. 6 is a circuit diagram of a second embodiment of the shift register shown in FIG. 3.

As shown in FIG. 6, an anti-reversal circuit of a shift register according to a second embodiment includes a ninth transistor T9, instead of the seventh transistor T7 and the eighth transistor T8 shown in FIG. 4. The ninth transistor T9 has a ninth conductive path between the control electrode of the second transistor T2, the voltage electrode 46 and the output terminal 44. The ninth transistor T9 is a p-MOS transistor for example. A drain thereof is electrically connected to the second transistor T2 through a node n2, a source thereof is electrically connected to the voltage electrode 46, and a gate thereof is electrically connected to the output terminal 44.

At the moment t3 shown in FIG. 5, when electric potential of the first clock signal C1 is reversed from a high level to a low level, electric potential of the output signal OUT is changed to a low level. Since the ninth transistor T9 is turned on and a high voltage VDD is supplied to the node n2, the second transistor T2 and a sixth transistor T6 are turned off. In this way, it is possible to output the output signal OUT at a low level without distortion during the interval when the first clock signal C1 is reversed from the high level to the low level in the state where the first transistor T1 is turned on and the second transistor T2 is turned off.

Third Embodiment

Figure 7:
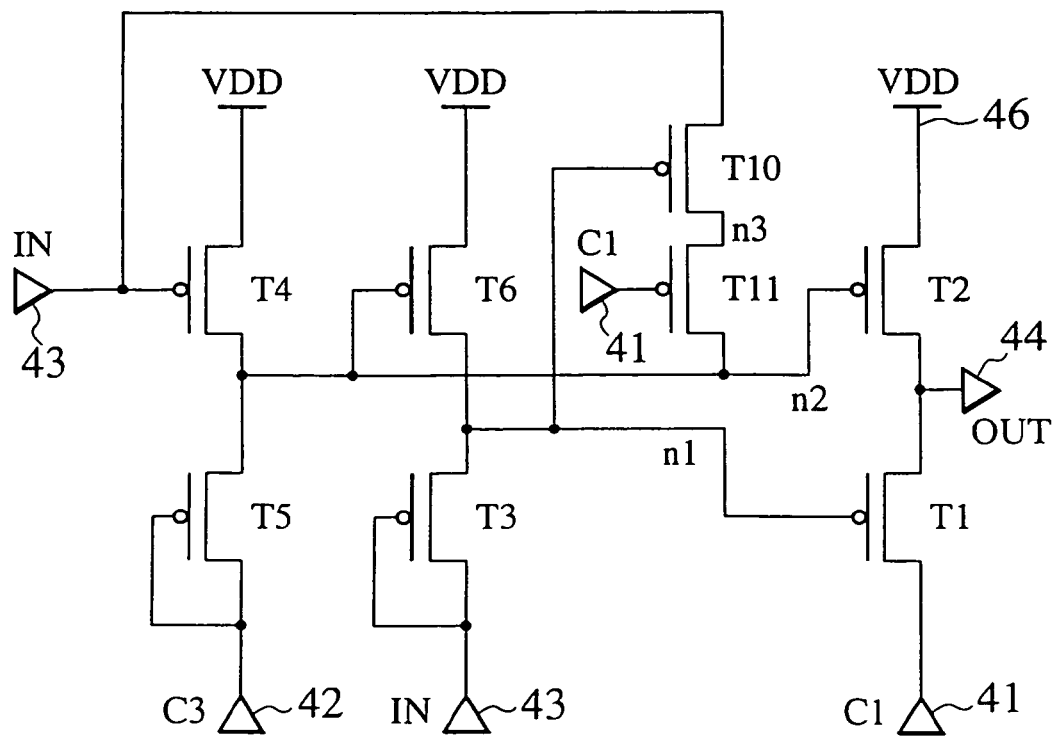
FIG. 7 is a circuit diagram of a third embodiment of the shift register shown in FIG. 3.

As shown in FIG. 7, an anti-reversal circuit of a shift register according to a third embodiment includes a tenth transistor T10 and an eleventh transistor T11, instead of the seventh transistor T7 and the eighth transistor T8 shown in FIG. 4. The tenth transistor T10 has a tenth conductive path between the control electrode of the first transistor T1 and the input terminal 43. The eleventh transistor T11 has a eleventh conductive path between the control electrode of the second transistor T2, the first clock terminal 41 and the tenth transistor T10. The tenth transistor T10 and the eleventh transistor T11 are p-MOS transistors for example. A source of the tenth transistor T10 is electrically connected to the input terminal 43 and a gate thereof is electrically connected to the control electrode of the first transistor T1 through a node n1. The eleventh transistor T11 is electrically connected as similar to the eighth transistor T8. An input signal IN is supplied from a shift register in a precedent stage to the source of the tenth transistor T10.

At a moment t3 shown in FIG. 5, the input signal IN at a high level is supplied to a node n2 through the tenth transistor T10 and the eleventh transistor T11. So, the second transistor T2 and a sixth transistor T6 are turned off. In this way, it is possible to output the output signal OUT at a low level without distortion during the interval when the first clock signal C1 is reversed from the high level to the low level in the state where the first transistor T1 is turned on and the second transistor T2 is turned off.

Fourth Embodiment

Figure 8:
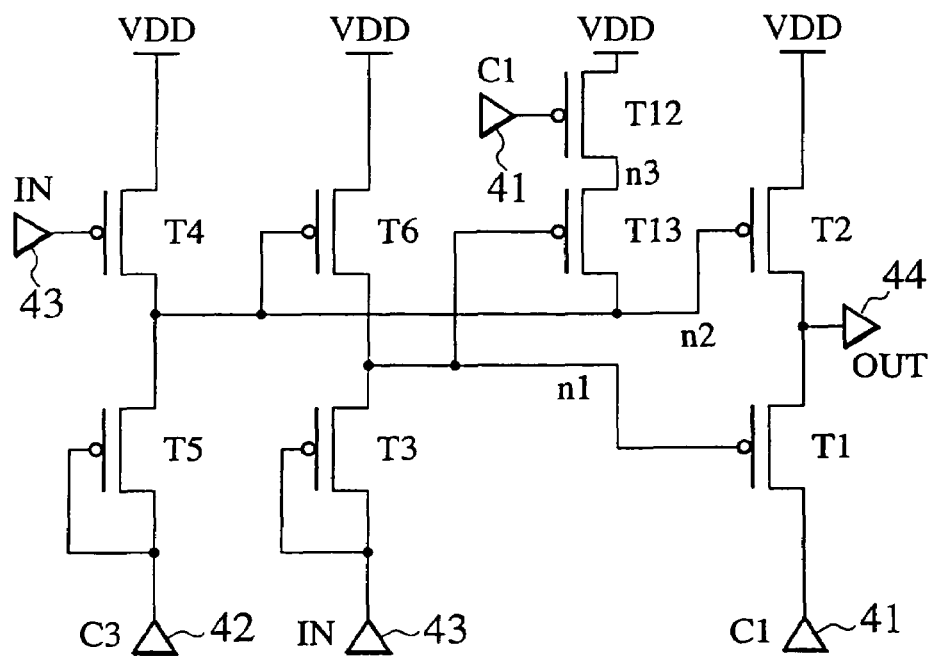
FIG. 8 is a circuit diagram of a fourth embodiment of the shift register shown in FIG. 3.

As shown in FIG. 8, an anti-reversal circuit of a shift register according to a fourth embodiment includes a twelfth transistor T12 and a thirteenth transistor T13, instead of the seventh transistor T7 and the eighth transistor T8 shown in FIG. 4. The twelfth transistor T12 has a twelfth conductive path between the first clock terminal 41 and the voltage electrode 46. The thirteenth transistor T13 has a thirteenth conductive path between the control electrode of the first transistor T1, the control electrode of the second transistor T2 and the twelfth transistor T12.

This anti-reversal circuit has a constitution where the connecting destinations of the gates of the seventh transistor T7 and the eighth transistor T8 are interchanged with each other. Concretely, a source of the twelfth transistor T12 is electrically connected to the voltage electrode 46, and a gate thereof is electrically connected to the first clock terminal 41. A drain of the thirteenth transistor T13 is electrically connected to the control electrode of the second transistor T2 through the node n2, a gate thereof is electrically connected to the control electrode of the first transistor T1 through the node n1, and a source thereof is electrically connected to a drain of the twelfth transistor T12.

At a moment t1 shown in FIG. 5, when an input signal IN at a low level is inputted to the input terminal 43 whereby the node n1 is changed to a low level, the thirteenth transistor T13 is turned on. At a moment t3, when electric potential of the first clock signal C1 is changed to a low level, the twelfth transistor T12 is turned on. Since both the twelfth transistor T12 and the thirteenth transistor T13 are turned on and a high voltage VDD is thereby supplied to the node n2, the second transistor T2 and a sixth transistor T6 are turned off. In this way, it is possible to output the output signal OUT at a low level without distortion during the interval when the first clock signal C1 is reversed from the high level to the low level in the state where the first transistor T1 is turned on and the second transistor T2 is turned off.

Fifth Embodiment

Figure 9:
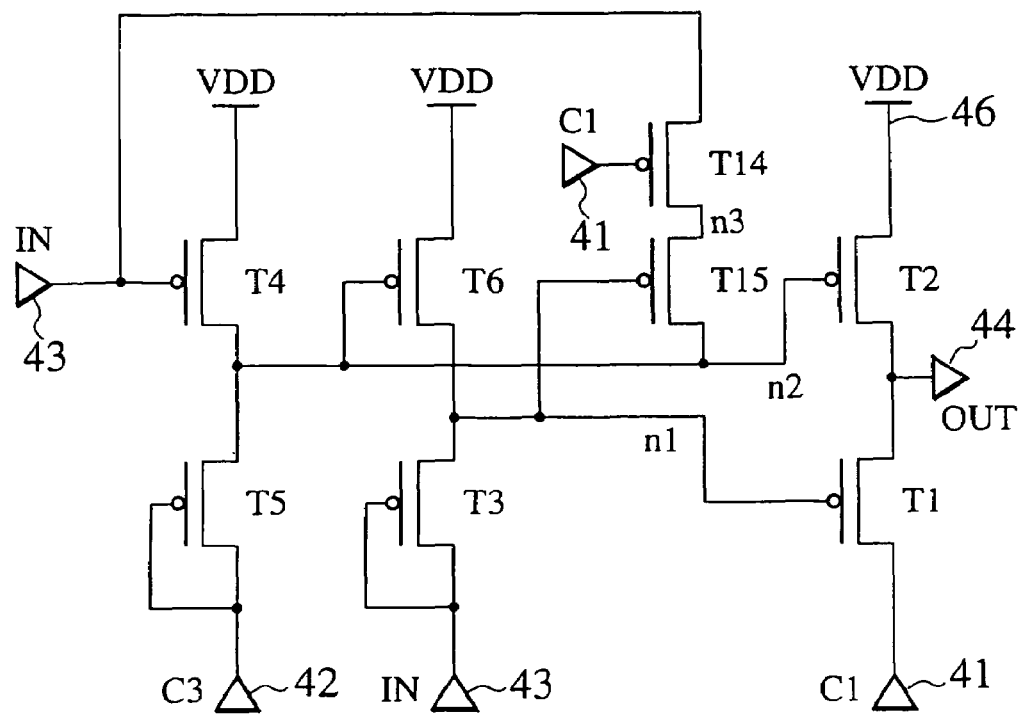
FIG. 9 is a circuit diagram of a fifth embodiment of the shift register shown in FIG. 3.

As shown in FIG. 9, an anti-reversal circuit of a shift register according to a fifth embodiment includes a fourteenth transistor T14 and a fifteenth transistor T15, instead of the seventh transistor T7 and the eighth transistor T8 shown in FIG. 4. The fourteenth transistor T14 has a fourteenth conductive path between the first clock terminal 41 and the input terminal 43. The fifteenth transistor T15 has a fifteenth conductive path between the control electrode of the second transistor T2, the control electrode of the first transistor T1 and the fourteenth transistor T14. This anti-reversal circuit has a constitution where the source of the twelfth transistor T12 shown in FIG. 8 is electrically connected to the input terminal 43.

At a moment t3 shown in FIG. 5, the fourteenth transistor T14 and the fifteenth transistor T15 are both set to an on-state. Since the input signal IN at a high level is supplied to the node n2 through the fourteenth transistor T14 and the fifteenth transistor T15, the second transistor T2 and a sixth transistor T6 are turned off. In this way, it is possible to output the output signal OUT at a low level without distortion during the interval when the first clock signal C1 is reversed from the high level to the low level in the state where the first transistor T1 is turned on and the second transistor T2 is turned off.

Sixth Embodiment

In each of the shift registers SR described in the first to the fifth embodiments, the electric potential of the node n1 becomes the level lower than the low level (the LL level) in an interval between the moment t3 and the moment t4 shown in FIG. 5. Accordingly, excessive electric potential is supplied to the source of the third transistor T3, to the drain of the sixth transistor T6, and to the gate of the seventh transistor T7.

Figure 10:
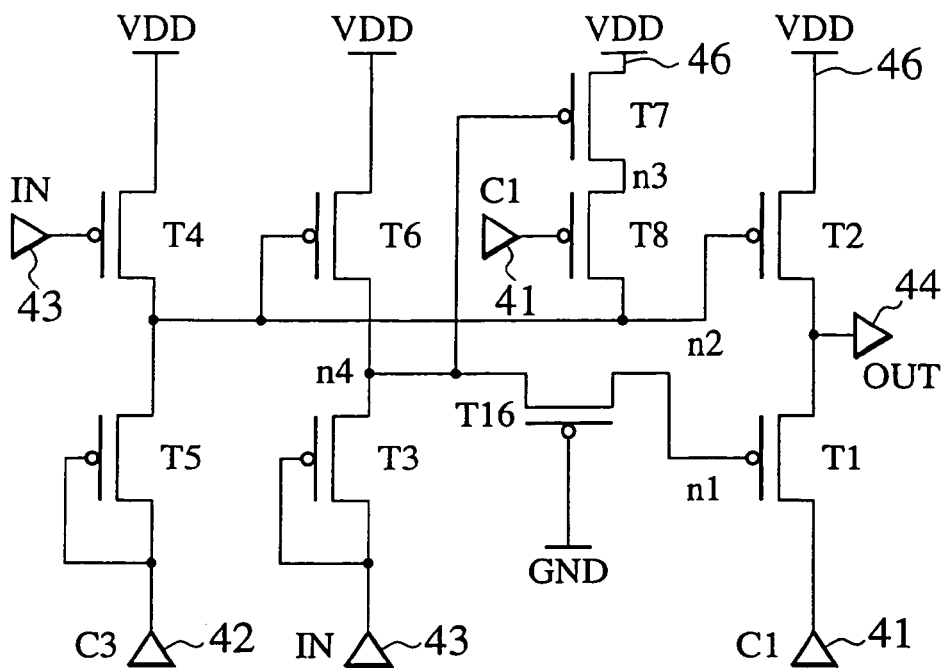
FIG. 10 is a circuit diagram of a sixth embodiment of the shift register shown in FIG. 3.

As shown in FIG. 10, a shift register according to a sixth embodiment has a constitution where an on-state sixteenth transistor T16 is provided on the node n1 of the shift register shown in FIG. 4. The sixteenth transistor T16 is a p-MOS transistor for example. Regarding the sixteenth transistor T16, a source thereof is electrically connected to a node of the source of the third transistor T3 and the drain of the sixth transistor T6, a drain thereof is electrically connected to the gate of the first transistor T1, and a gate thereof is electrically connected to ground potential GND. A conductive path to the source of the sixteenth transistor T16 is referred to as a node n4. A control electrode of the seventh transistor T7 is connected to the node n4.

Figure 11:
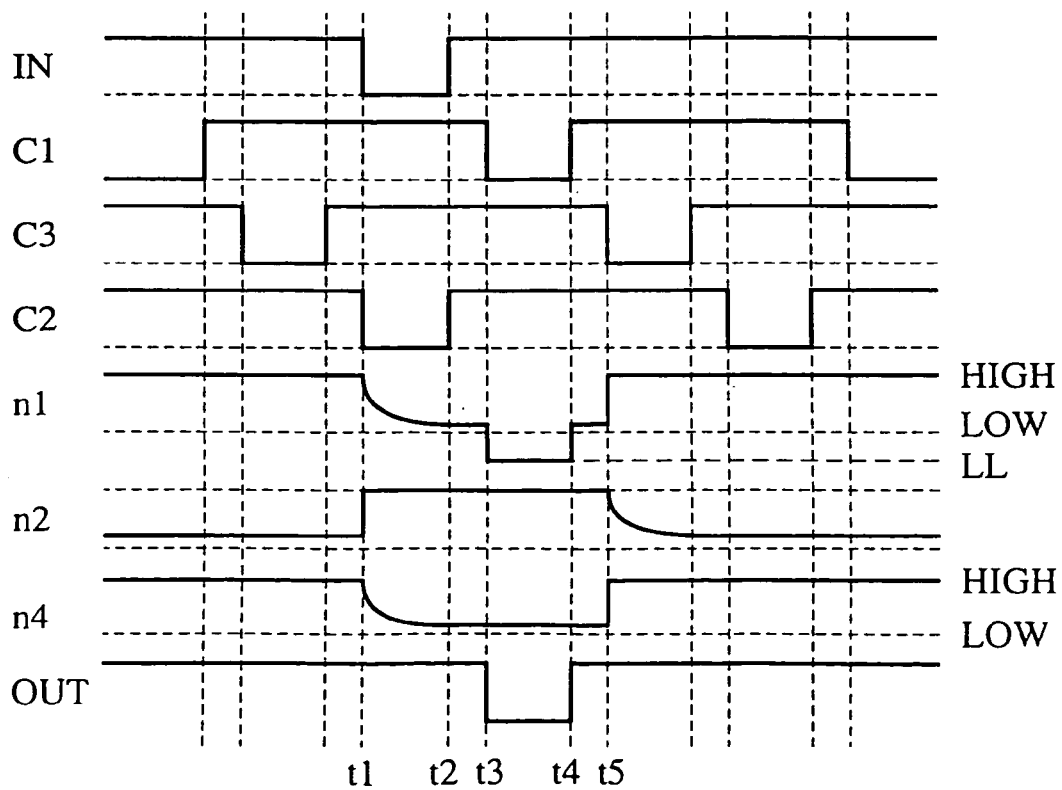
FIG. 11 is a timing chart showing relations among signals used in the shift register shown in FIG. 10.

FIG. 11 is a timing chart showing relations between the input signal IN, the clock signals C1 to C3, the nodes n1 to n4, and the output signal OUT in the shift register shown in FIG. 10.

At a moment t1, when the electric potential of the input signal IN is change to a low level, the third transistor T3 is turned on, whereby electric potential of the node n4 at a high level is reduced to the threshold of the third transistor T3. For example, if the threshold of the third transistor T3 is −1 V, the electric potential of the node n4 is reduced to 1 V. Moreover, since the sixteenth transistor T16 is in an on-state at this time, electric potential of the node n1 is also reduced in accordance with reduction of the electric potential of the node n4. For example, if a threshold of the sixteenth transistor T16 is −1 V, the electric potential of the node n1 is reduced to 1 V. Furthermore, the sixteenth transistor T16 approaches to an off-state in accordance with reduction of the electric potential of the node n4.

At a moment t2, when the electric potential of the input signal IN is changed to a high level, the third transistor T3 and the fourth transistor T4 are turned off. As described with FIG. 5, the node n1 maintains the low level and the node n2 maintains the high level.

In the interval between a moment t3 and a moment t4, when a first clock signal C1 is changed to a low level, the node n1 is changed to the LL level. When the electric potential of the node n4 is lowered accordingly, a voltage between the gate and the source of the sixteenth transistor T16 becomes lower than the threshold, whereby the sixteenth transistor T16 is completely turned off. In this way, the electric potential of the node n4 will not be reduced to lower than the threshold. Accordingly, excessive voltage will not be applied to the third transistor T3, to a sixth transistor T6, and to a seventh transistor T7. Therefore, it is possible to prevent variations in the characteristics of the respective transistors and to realize a shift register with high reliability.

Note that it is satisfactory for the electric potential of the gate of the sixteenth transistor T16 to be set to near the ground potential GND. A precaution required herein is not to set the electric potential of the gate too much lower than GND. In such a case, the excessive voltage will be applied between the gate and the source or the gate and the drain of the sixteenth transistor T16 when both electric potentials of the node n1 and the node n4 are at a high level. Then, insertion of the sixteenth transistor T16 becomes meaningless. Another precaution is not to set the electrical potential of the gate too much higher than GND. In this case, it is not possible to change the electric potential of the node n1 to the low level in an interval between the moment t1 and the moment t2. Accordingly, it will not be able to reduce the electric potential of the node n1 to the LL level in the interval between the moment t3 and the moment t4.

Moreover, provision of the sixteenth transistor T16 on the node n1 is not only applicable to the shift register shown in FIG. 4, but it is also applicable to the shift registers shown in FIG. 6 to FIG. 9.

Figure 12:
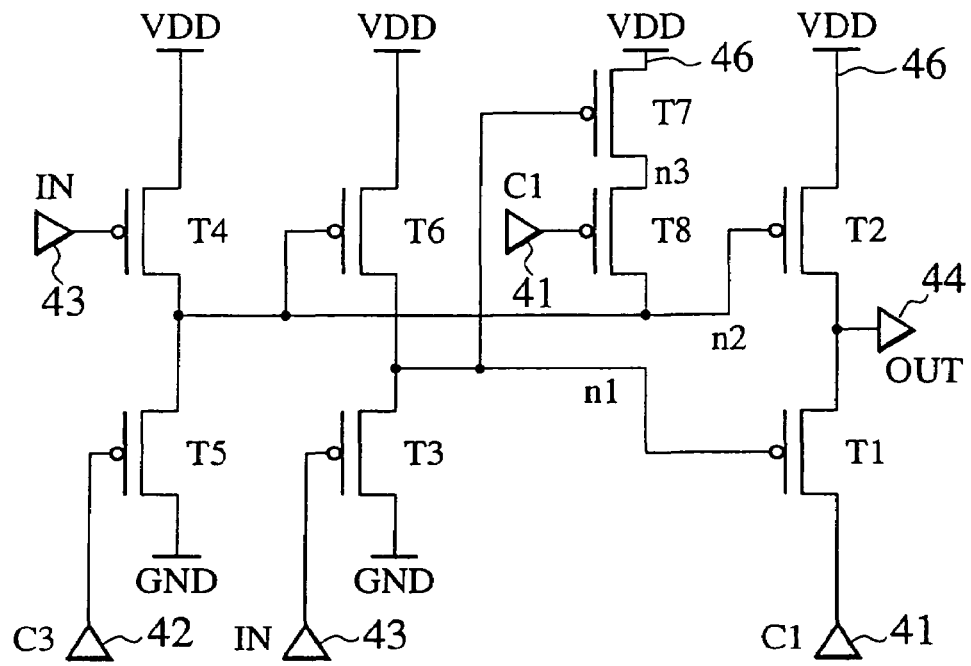
FIG. 12 is a circuit diagram of a modified example of the shift register shown in FIG. 3.
Figure 13:
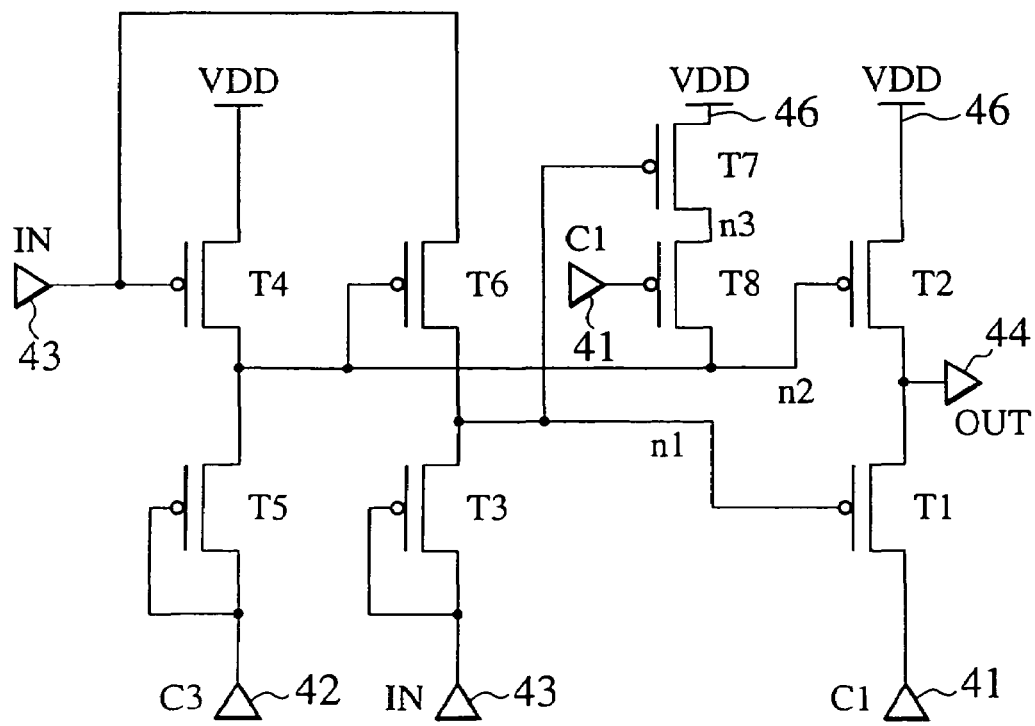
FIG. 13 is a circuit diagram of another modified example of the shift register shown in FIG. 3.

Without limitation to the examples shown in FIG. 4 to FIG. 10, various circuit structures are conceivable for a basic constitution of a shift register providing an anti-reversal circuit. For example, as shown in FIG. 12, it is applicable that the gate of the third transistor T3 is electrically connected to the input terminal 43, while a drain thereof is electrically connected to ground potential GND. Otherwise, as similarly shown in FIG. 12, it is also applicable that the gate of the fifth transistor T5 is electrically connected to the second clock terminal 42, while the drain thereof is electrically connected to the ground potential GND. Otherwise, as shown in FIG. 13, it is also applicable that the source of the sixth transistor T6 is electrically connected to the input terminal 43.

Seventh Embodiment

Figure 14:
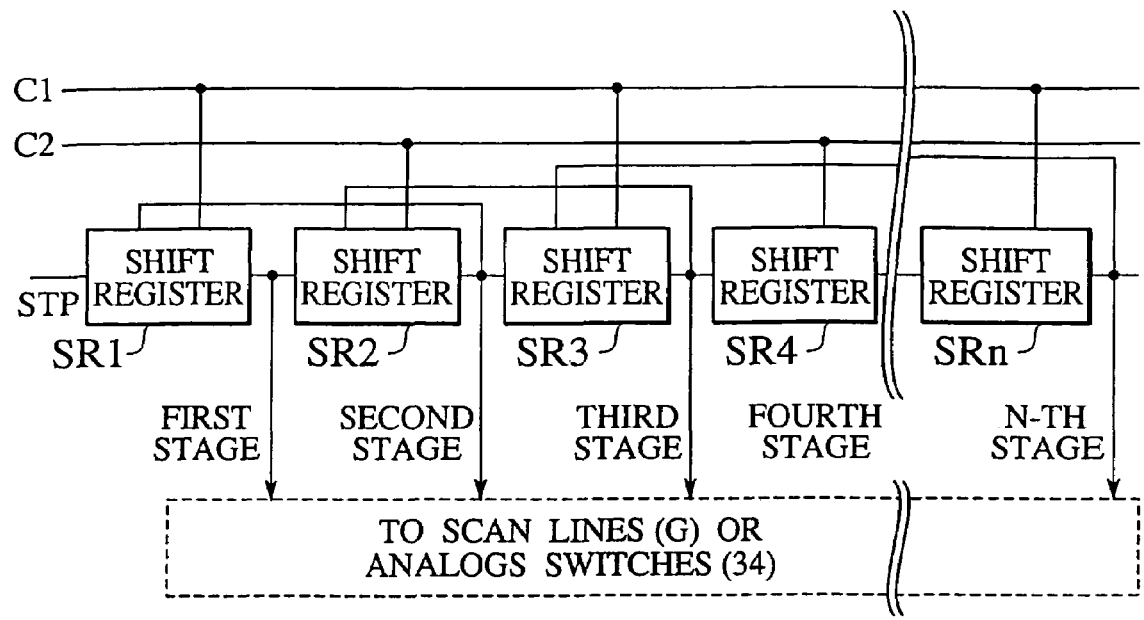
FIG. 14 is a block diagram of a seventh embodiment of a two-phase shift register used for the vertical shift register or the horizontal shift register shown in FIG. 1.

A two-phase shift register shown in FIG. 14 according to a seventh embodiment can be used for at least any one of the vertical shift register 22 and the horizontal shift register 32 shown in FIG. 1. Here, for the sake of convenience, one of the drive circuits using the two-phase shift register will be referred to as a first drive circuit, and the other will be referred to as a second drive circuit.

When this two-phase shift register is used, it is possible to curtail the number of clock signals from three to two in comparison with the three-phase shift register. That is, any one of the clock signals is inputted to the respective shift registers SR. Since the shift registers can be downsized, it is possible to realize the downsizing of a frame of a display device as well as low power consumption.

Figure 15A:
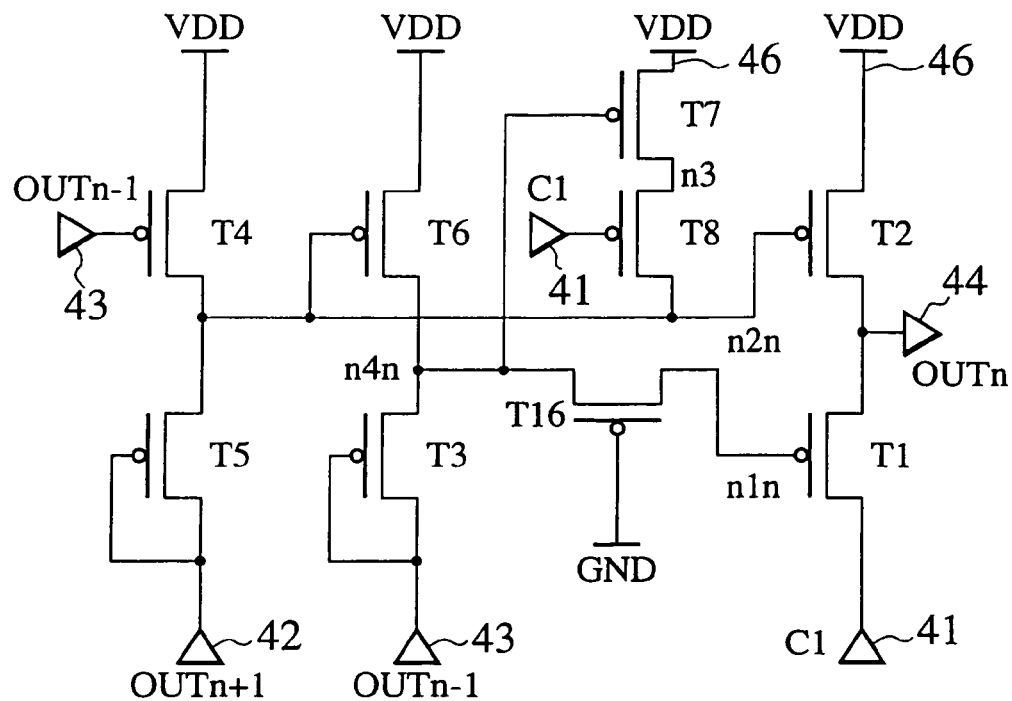
FIGS. 15A and 15B are circuit diagrams of the seventh embodiment of shift resisters shown in FIG. 14.
Figure 15B:
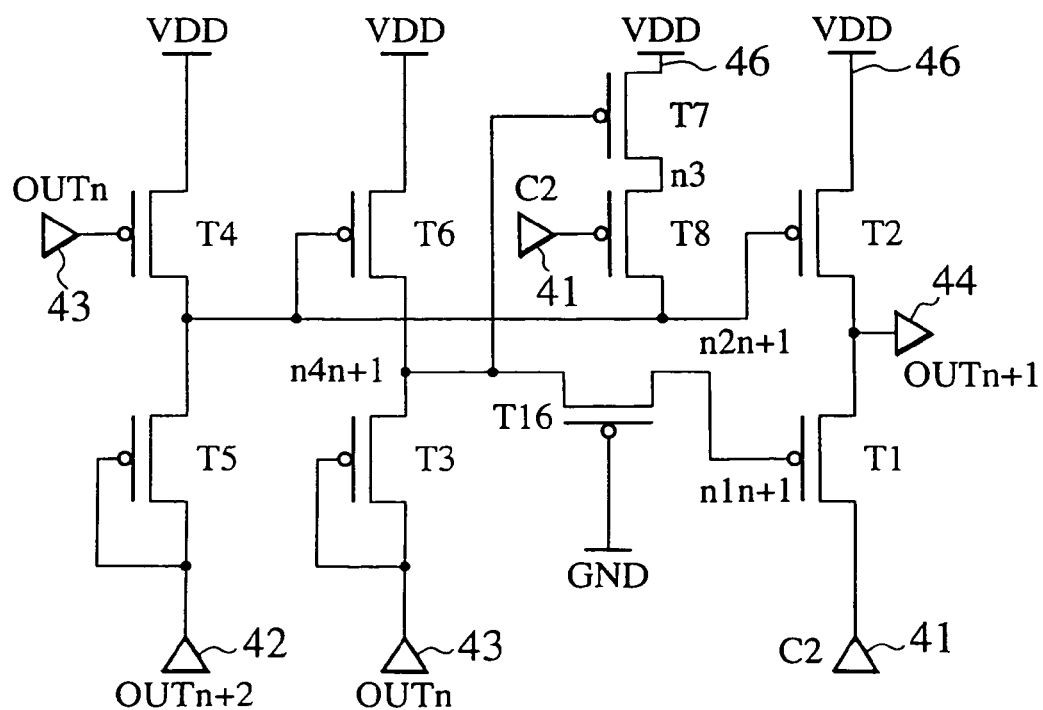

FIG. 15A shows a shift register at an n-th stage of the two-phase shift register, and FIG. 15B shows a shift register at an (n+1)-th stage thereof. Fundamental constitutions of the shift registers shown in FIGS. 15A and 15B are based on the shift register of the sixth embodiment shown in FIG. 10.

At the n-th stage, an output signal OUTn+1 from the (n+1)-th stage is inputted to the second clock terminal 42 instead of the second clock signal C3. At the (n+1)-th stage, an output signal OUTn+2 from an (n+2)-th stage is inputted to the second clock terminal 42. Meanwhile, the first clock signal C1 is inputted to the first clock terminal 41 at the n-th stage, and the second clock signal C2 is inputted to the first clock terminal 41 at the (n+1)-th stage. On the other hand, when the second clock signal C2 is inputted to the first clock terminal 41 at the n-th stage, the first clock signal C1 is inputted to the first clock terminal 41 at the (n+1)-th stage.

Figure 16:
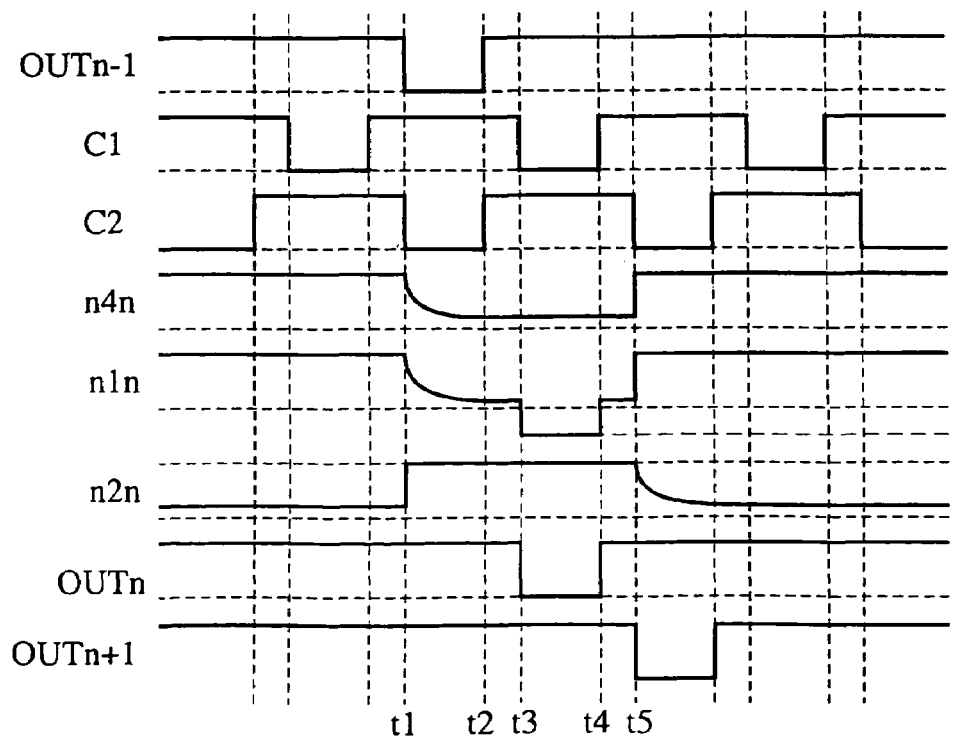
FIG. 16 is a timing chart of relations among signals used in the shift registers shown in FIGS. 15A and 15B.

FIG. 16 is a timing chart showing relations between signals used in the respective shift registers shown in FIGS. 15A and 15B. Because of using the two-phase shift register, pulse widths of the clock signals C1 and C2 are made shorter than those of the three-phase shift register shown in FIG. 5.

Note that the above-described constitution of supplying an output signal from a shift register at a subsequent stage to the second clock terminal 42 is also applicable to the shift registers of all the foregoing embodiments.

Eighth Embodiment

Figure 17A:
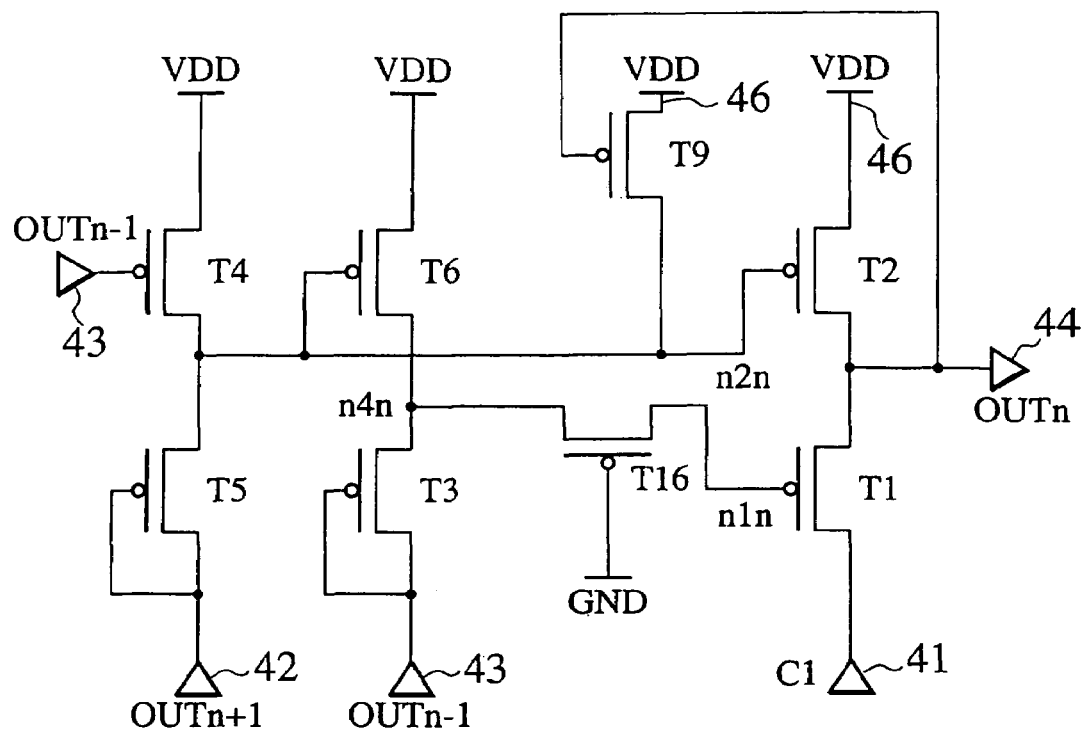
FIGS. 17A and 17B are circuit diagrams of an eighth embodiment of the shifter registers shown in FIG. 14.
Figure 17B:
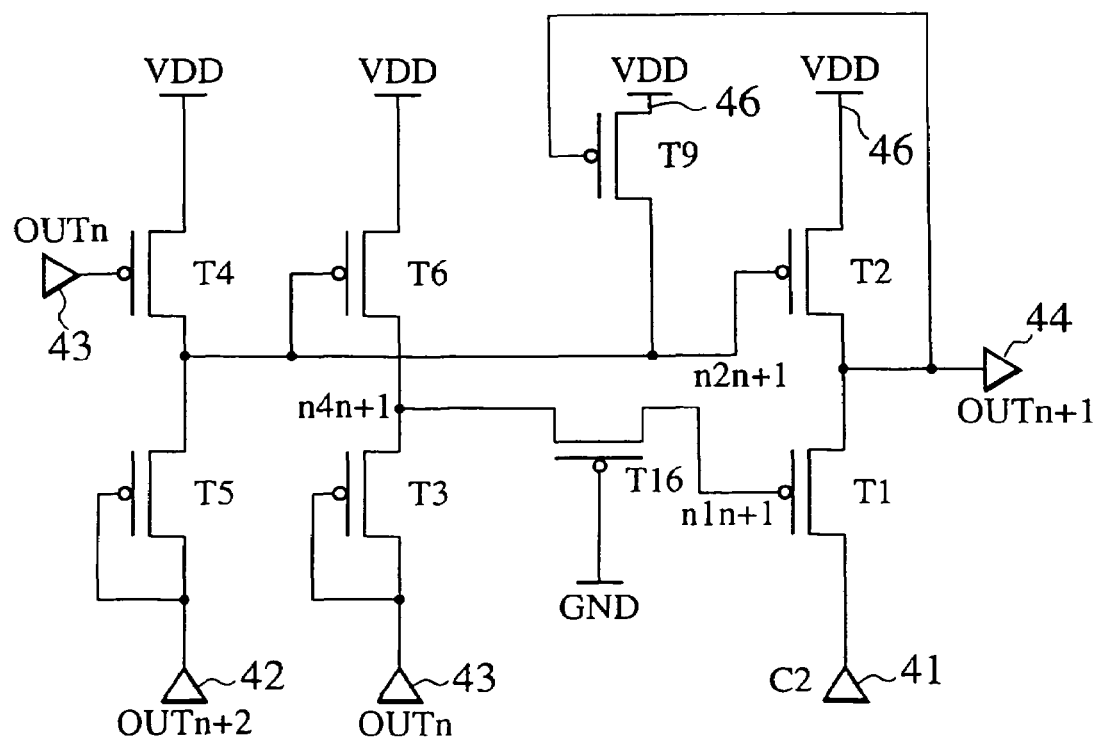

FIG. 17A shows a shift register at an n-th stage of a two-phase shift register according to an eighth embodiment, and FIG. 17B shows a shift register at an (n+1)-th stage thereof. Fundamental constitutions of the shift registers shown in FIGS. 17A and 17B are based on the shift register of the second embodiment as shown in FIG. 6. Similar to the shift registers shown in FIGS. 15A and 15B, an output signal OUT from a shift register at a subsequent stage is supplied to the second clock terminal 42 of each of the shift registers shown in FIGS. 17A and 17B. The shift registers of FIGS. 17A and 17B are also operated basically in accordance with the timing chart shown in FIG. 16. Since the shift registers are also downsized in these constitutions, it is possible to realize the downsizing of a frame of a display device as well as low power consumption.

Note that the above-described constitution of supplying an output signal from a shift register at a subsequent stage to the second clock terminal 42 is also applicable to the shift registers of all the foregoing embodiments.

Ninth Embodiment

Figure 18:
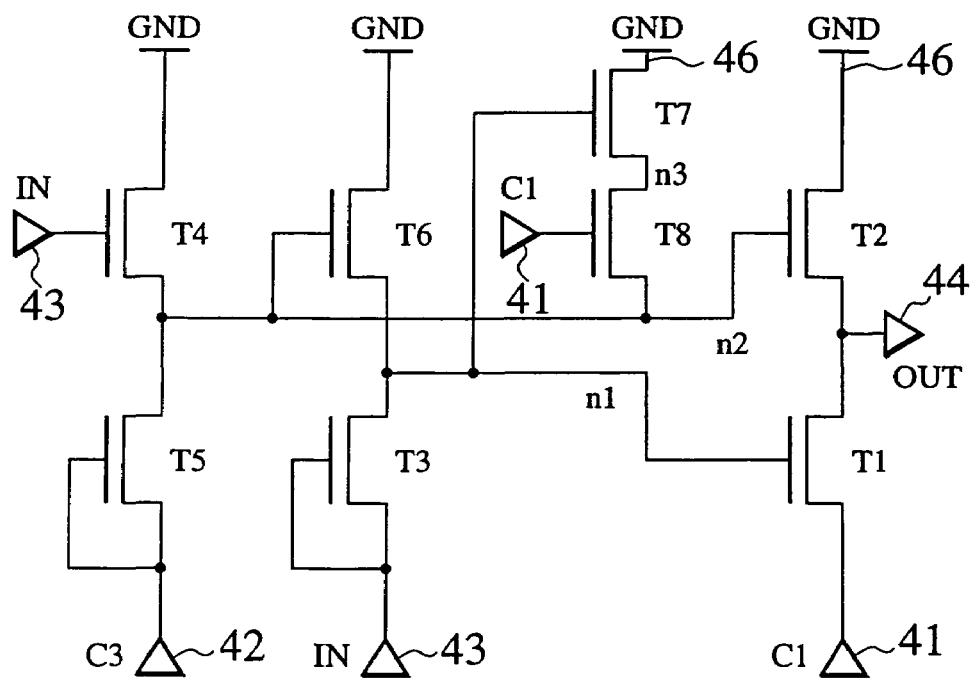
FIG. 18 is a circuit diagram of a ninth embodiment of the shift register shown in FIG. 3.

Heretofore, description has been made throughout the first to the eighth embodiments regarding a case where the shift register is composed only of the p-MOS transistors for shifting the phase of the input signal IN having a concave waveform. Alternatively, it is also possible to arrange a shift resister composed only of n-MOS transistors for shifting a phase of an input signal IN having a convex waveform. As shown in FIG. 18, all the transistors in the shift register of a ninth embodiment are n-MOS transistors. This shift register has a constitution where all the transistors shown in FIG. 4 are replaced by n-MOS transistors, and the voltage electrode 46 is connected to the ground potential GND. As a matter of course, without limitation to the shift register of FIG. 4, n-MOS transistors may replace the p-MOS transistors of the shift register in any of the other embodiments.

In addition, usage of the shift register according to any one of the first to ninth embodiments is not limited to the above-mentioned drive circuit, the electrode substrate and the display device, it is generally applicable to various electronic circuits.

Note that the drive circuits such as the scan line drive circuit 21 and the signal line drive circuit 31 are not always required to be formed integrally with the pixel unit 11 on the first electrode substrate 10. For example, such drive circuits may be those disposed on an external drive substrate together with control ICs.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A drive circuit comprising:
    a plurality of shift registers electrically cascaded in a manner whereby an output signal from an output terminal of each of the shift registers is inputted to an input terminal of another one of the shift registers, each of the shift registers including:
    an output circuit having a first transistor having a first conductive path between a first clock terminal and an output terminal, and a second transistor having a second conductive path between the output terminal and a voltage electrode,
    an input circuit having a third transistor having a third conductive path between an input terminal and a control electrode of the first transistor, and a fourth transistor having a fourth conductive path between the input terminal and a control electrode of the second transistor,
    a reset circuit having a fifth transistor having a fifth conductive path between a second clock terminal and the control electrode of the second transistor, and a sixth transistor having a sixth conductive path between the control electrode of the first transistor and the control electrode of the second transistor,
    an anti-reversal circuit configured to prevent a voltage level at the control electrode of the second transistor from being reversed when a voltage level of a first clock signal inputted to the first clock terminal is reversed in the state where the first transistor is turned on and the second transistor is turned off, and
    a plurality of output lines to output the output signals to the exterior of the shift registers,
    wherein a phase-shifted clock signal is inputted to each of the first clock terminals of the shift registers as a first clock signal, and
    a second clock signal that is a phase-shifted signal with respect to the first clock signal is inputted to each of the second clock terminals of the shift registers.

2. A drive circuit comprising:
    a plurality of shift registers electrically cascaded in a manner whereby an output signal from an output terminal of each of the shift registers is inputted to an input terminal of another one of the shift registers, each of the shift registers including:
    an output circuit having a first transistor having a first conductive path between a first clock terminal and an output terminal, and a second transistor having a second conductive path between the output terminal and a voltage electrode,
    an input circuit having a third transistor having a third conductive path between an input terminal and a control electrode of the first transistor, and a fourth transistor having a fourth conductive path between the input terminal and a control electrode of the second transistor,
    a reset circuit having a fifth transistor having a fifth conductive path between a second clock terminal and the control electrode of the second transistor, and a sixth transistor having a sixth conductive path between the control electrode of the first transistor and the control electrode of the second transistor,
    an anti-reversal circuit configured to prevent a voltage level at the control electrode of the second transistor from being reversed when a voltage level of a first clock signal inputted to the first clock terminal is reversed in the state where the first transistor is turned on and the second transistor is turned off, and
    a plurality of output lines to output the output signals to the exterior of the shift registers,
    wherein a phase-shifted clock signal is inputted to each of the first clock terminals of the shift registers as a first clock signal, and
    an output signal of a shift register at a subsequent stage with respect to each of the shift registers is inputted to each of the second clock terminals of each of the shift registers.

3. An electrode substrate comprising:
    two drive circuits;
    a plurality of pixel transistors provided on intersections of output lines from one of the drive circuits and output lines of the other drive circuit; and
    a plurality of pixel electrodes provided on each of the pixel transistors,
    wherein at least any one of the two drive circuits is a first drive circuit that includes:
    a plurality of shift registers electrically cascaded in a manner whereby an output signal from an output terminal of each of the shift registers is inputted to an input terminal of another one of the shift registers, each of the shift registers having
    an output circuit having a first transistor having a first conductive path between a first clock terminal and an output terminal, and a second transistor having a second conductive path between the output terminal and a voltage electrode,
    an input circuit having a third transistor having a third conductive path between an input terminal and a control electrode of the first transistor, and a fourth transistor having a fourth conductive path between the input terminal and a control electrode of the second transistor,
    a reset circuit having a fifth transistor having a fifth conductive path between a second clock terminal and the control electrode of the second transistor, and a sixth transistor having a sixth conductive path between the control electrode of the first transistor and the control electrode of the second transistor, an anti-reversal circuit configured to prevent a voltage level at the control electrode of the second transistor from being reversed when a voltage level of a first clock signal inputted to the first clock terminal is reversed in the state where the first transistor is turned on and the second transistor is turned off; and a plurality of output lines to output the output signals to the exterior of the shift registers, wherein the first drive circuits is a scan line drive circuit of a display device, and outputs an output signal from each of the shift registers to each of the pixel transistors through each of the output lines.

4. A electrode substrate comprising:

two drive circuits;

a plurality of pixel transistors provided on intersections of output lines from one of the drive circuits and output lines of the other drive circuit; and a plurality of pixel electrodes provided on each of the pixel transistors, wherein at least any one of the two drive circuits is a first drive circuit that includes:

a plurality of shift registers electrically cascaded in a manner whereby an output signal from an output terminal of each of the shift registers is inputted to an input terminal of another one of the shift registers, each of the shift registers having an output circuit having a first transistor haying a first conductive path between a first clock terminal and an output terminal, and a second transistor having a second conductive path between the output terminal and a voltage electrode, an input circuit having a third transistor having a third conductive path between an input terminal and a control electrode of the first transistor, and a fourth transistor having a fourth conductive path between the input terminal and a control electrode of the second transistor, a reset circuit having a fifth transistor having a fifth conductive path between a second clock terminal and the control electrode of the second transistor, and a sixth transistor having a sixth conductive path between the control electrode of the first transistor and the control electrode of the second transistor, an anti-reversal circuit configured to prevent a voltage level at the control electrode of the second transistor from being reversed when a voltage level of a first clock signal inputted to the first clock terminal is reversed in the state where the first transistor is turned on and the second transistor is turned off; and a plurality of output lines to output the output signals to the exterior of the shift registers, wherein the first drive circuit is a signal line drive circuit of a display device, and includes a plurality of analog switches provided on the output lines, the first drive circuit outputs the output signal from each of the shift registers with respect to each of the analog switches, and outputs an image signal to each of the pixel transistors through each of the analog switches.

* * * * *